(12) United States Patent
Chiang et al.

(10) Patent No.: US 6,844,785 B2
(45) Date of Patent: Jan. 18, 2005

(54) PHASE-LOCK LOOP FOR PREVENTING FREQUENCY DRIFT AND JITTER AND METHOD THEREOF

(75) Inventors: Ming-Cheng Chiang, Hsinchu (TW); Jui-Cheng Huang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 49 days.

(21) Appl. No.: 10/459,577

(22) Filed: Jun. 12, 2003

(65) Prior Publication Data

US 2003/0231069 A1 Dec. 18, 2003

(30) Foreign Application Priority Data

Jun. 17, 2002 (TW) ............................................ 91113194

(51) Int. Cl.$^7$ .............................. H03L 7/06; H03L 7/18
(52) U.S. Cl. ......................................... 331/1 A; 331/18
(58) Field of Search ........................... 331/1 A, 16, 17, 331/18, 25; 327/156–159; 332/127; 360/51; 375/376; 455/260

(56) References Cited

U.S. PATENT DOCUMENTS 6,711,227 B1 * 3/2004 Kaylani et al. ............. 375/372

* cited by examiner

*Primary Examiner*—David Mis
(74) *Attorney, Agent, or Firm*—Bacon & Thomas PLLC

(57) ABSTRACT

A phase-lock loop for preventing frequency drift and jitter problems is disclosed. A phase comparator compares an input signal and a feedback signal, and outputs a control voltage according to phase difference therebetween. A voltage-controlled oscillator outputs a plurality of multiple phase oscillating signals according to the control voltage. A phase swallower receives a plurality of multiple phase oscillating signals, and generates a phase swallow signal. The phase swallow signal is formed by adding or removing one phase in the oscillating signal per predetermined number of clocks. An output frequency divider divides the frequency of the phase swallow signal so as to generate a desired output signal.

20 Claims, 4 Drawing Sheets

PHASE-LOCK LOOP FOR PREVENTING FREQUENCY DRIFT AND JITTER AND METHOD THEREOF

BACKGROUND OF THE INVENTION

1. Field of the Invention

The present invention relates to a phase-lock loops, and particularly to a phase-lock loop for preventing frequency drift and jitter.

2. Description of Related Art

With the improvement of electronic technology, a variety of applications can be provided by electronic products. For example, local area networks serve to provide a network connection function to a personal computer. In a currently used Ethernet communication protocol, 125 MHz is used as an operating frequency of the transmitter and receiver. However, in other applications, especially in TV images, 14.318 MHz is used as an operating frequency. Therefore, as these two applications are commonly used in a single printed circuit board (PCB), it is unavoidable that two oscillators are used to generate 14.318 MHz and 125 MHz.

Since modern demands of the public users that electronic products must be as compact as possible, two oscillators are used in one electronic product will cause the product to be excessively large and the cost is accordingly too high. Thereby, there is an eager demand for generating the two frequencies by a single oscillator. Moreover, the 14.318 MHz oscillator is cheaper than the 125 MHz oscillator. Thereby, one effective method is to use an oscillator of 14.318 MHz on the PCB, while the phase-lock loop is used to oscillate the 14.318 MHz into 125 MHz.

However, 125 MHz is not integral times of 14.318 MHz. Thus, in fact, it is impossible to oscillate 14.318 MHz into 125 MHz directly. Accordingly, in a practical implementation, the frequency of 14.318 MHz is divided by a large quantity (for example several hundreds) first, and then multiply the divided frequency to be near 125 MHz. However, this conventional method has some disadvantages, such as the phase-lock loop for oscillating several hundred times will have a long duration jitter and the acquired frequency is not exactly equal to 125 MHz and then frequency drift will be generated.

A phase-locked loop (PLL) with a fractional phase swallowing circuit is described in U.S. Pat. No. 5,889,436, entitled "Phase Locked Loop Fractional Pulse Swallowing Frequency Synthesizer". A low jitter fractional divider is described in U.S. Pat. No. 5,910,110, entitled "Precise, Low Jitter Fractional Divider Using Counter of Rotating Clock Phases". Although a state machine coupled to a divider is described in FIG. 3 and FIG. 7 of U.S. Pat. No. 5,889,436, but this application presents that "the frequency synthesizer generates a synthesized output signal with low jitter" and "Divider may be deleted, depending upon the desired output frequency".

Therefore, there is a need to have a novel design for a phase-locked loop that can mitigate and/or obviate the aforementioned problems.

SUMMARY OF THE INVENTION

The object of the present invention is to provide a phase-lock loop for preventing frequency drift and jitter and method thereof, wherein the output signal is drift-free so that the frequency jitter can be controlled for a longer duration, which is under the requirement of the application.

Another object of the present invention is to provide a phase-lock loop for preventing frequency drift and jitter and method thereof, wherein an oscillator with a frequency of 14.318 MHz is used to generate a signal with a frequency of precise 125 MHz.

In accordance with one aspect of the present invention, there is provided a phase-lock loop for preventing frequency drift and jitter, which comprises: a phase-lock loop for receiving an input signal and outputting a plurality of multiple phase oscillating signals corresponding to the input signal; a phase swallower for receiving the multiple phase oscillating signals, and generating a phase swallow signal by adding or removing one phase in the oscillating signals per X clocks, where X is a positive integer, and an output frequency divider for dividing the frequency of the phase swallow signal so as to generate an output signal.

In accordance with another aspect of the present invention, there is provided a phase-lock loop for preventing frequency drift and jitter, which comprises: a phase-lock loop having a phase comparator, a voltage-controlled oscillator, and a feedback frequency divider, the phase comparator comparing an input signal and a feedback signal and outputting a control voltage according to phase difference between the input signal and the feedback signal; the voltage-controlled oscillator outputting a plurality of multiple phase oscillating signals according to the control voltage; a phase swallower for receiving the plurality of multiple phase oscillating signals, and generating a phase swallow signal by adding or removing one phase in the oscillating signals per X clocks, where X is a positive integer; and an output frequency divider for dividing the frequency of the phase swallow signal by a divisor S so as to generate an output signal.

In accordance with still another aspect of the present invention, there is provided a phase-lock loop for preventing frequency drift and jitter problems, which comprises: a plurality of multiple phase oscillating signals; a phase swallower for receiving the plurality of multiple phase oscillating signals, and generating a phase swallow signal by adding or removing at least one phase in the oscillating signals per X clocks, where X is an integer; and a frequency divider for dividing the frequency of the phase swallow signal by a divisor S so as to generate an output signal, where S is equal to X or integral times of X.

In accordance with further another aspect of the present invention, there is provided a method for preventing frequency drift and jitter, which comprises the steps of: generating a plurality of multiple phase oscillating signals; generating a phase swallow signal based on the plurality of multiple phase oscillating signals, the phase swallow signal being formed by adding or removing one phase in the oscillating signal per X clocks, where X is a positive integer; and dividing the frequency of the phase swallow signal by a divisor S so as to generate an output signal, wherein S is equal to X or integral times of X.

The various objects and advantages of the present invention will be more readily understood from the following detailed description when read in conjunction with the appended drawings.

BRIEF DESCRIPTION OF THE PREFERRED EMBODIMENTS

Figure 1:
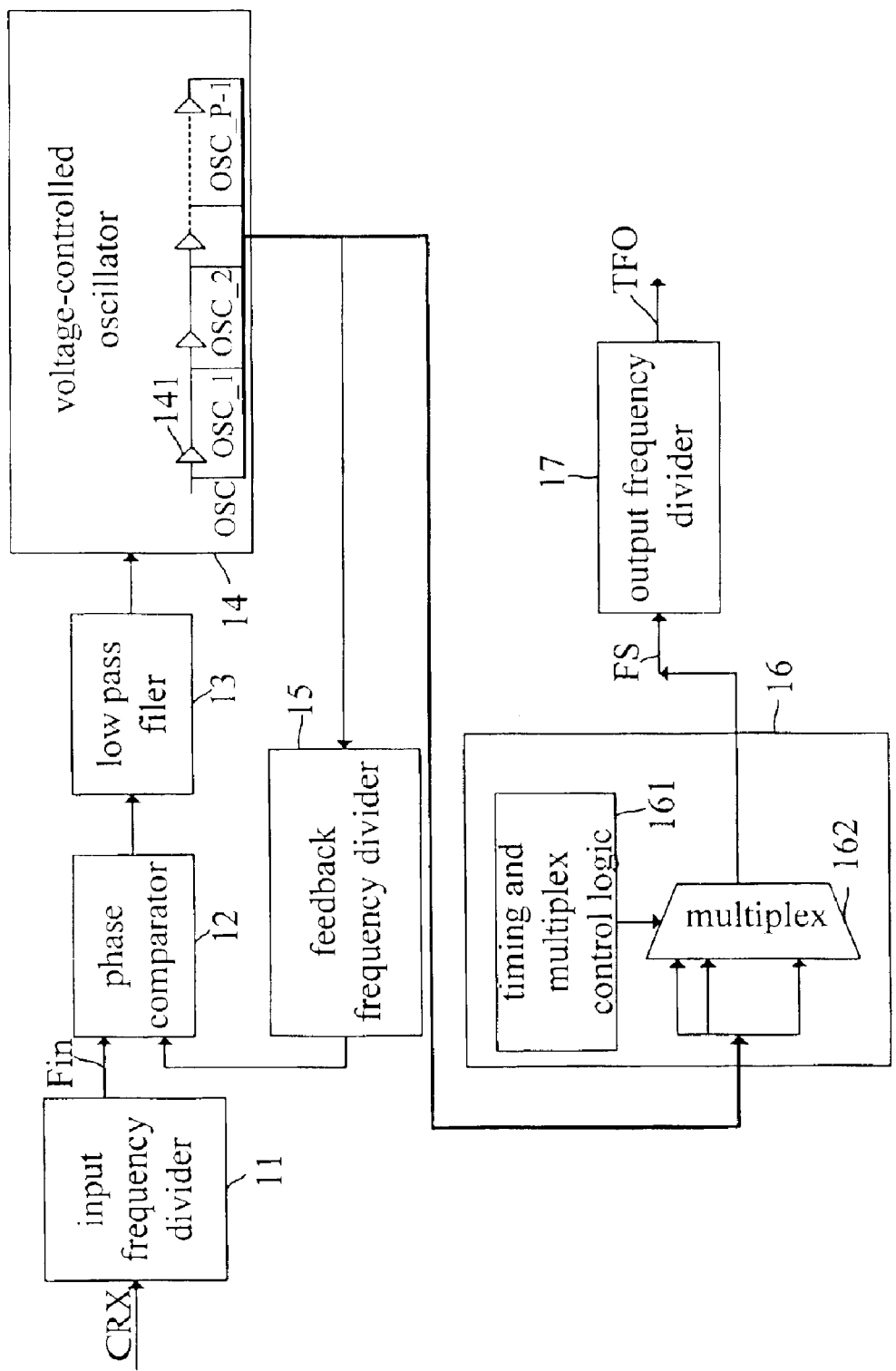
FIG. 1 shows a block diagram of a phase-lock loop in accordance with the present invention.

Referring to FIG. 1, a preferred embodiment of a phase-lock loop for preventing frequency drift and jitter in accordance with the present invention is illustrated. The phase-lock loop comprises an input frequency divider 11, a phase comparator 12, a low pass filer 13, a voltage-controlled oscillator 14, a feedback frequency divider 15, a phase swallower 16, and an output frequency divider 17. The input frequency divider 11, phase comparator 12, low pass filer 13, voltage-controlled oscillator 14 and the feedback frequency divider 15 are formed as a phase-lock loop.

In the aforementioned phase-lock loop, the input frequency divider 11 divides the frequency of an input reference signal CRX by M (M is an integer). The feedback frequency divider 15 divides the frequency of an oscillating signal OSC by N (N is an integer). The phase comparator 12 compares the output signal of the input frequency divider 11 with the output signal of the feedback frequency divider 15 for detecting a phase difference of these two signals. The low pass filer 13 filters out high frequency noise of the phase difference. The voltage-controlled oscillator 14 generates an oscillating signal OSC according to the phase difference processed by the low pass filer 13 and at least a phase-shift oscillating signal having a frequency substantially the same with the oscillating signal OSC. The phase-shift oscillating signal is one phase different with the oscillating signal. The voltage-controlled oscillator may be a ring oscillator. As shown in FIG. 1, P delay elements 141 are serially connected as a ring oscillator. The voltage-controlled oscillator 14 generates the oscillating signal OSC and P−1 phase-shift oscillating signal OSC_1~OSC_P−1. Totally, there are P phase oscillating signals. Each adjacent phase has only a phase difference of $(1/f_{OSC})/P$ time unit, where $f_{OSC}$ is the frequency of the oscillating signal OSC.

According to the aforementioned phase-lock loop, by controlling the divisors M and N of the input frequency divider 11 and feedback frequency divider 15, respectively, the $f_{OSC}$ of oscillating signal OSC and the frequency $f_{CRX}$ of the input reference signal CRX can be derived, where $f_{OSC}=(f_{CRX}/M)*N$. The phase swallower 16 serves to swallow the phase of the P oscillating signals, wherein the phase of the oscillating signals are different. Namely, under the control of the timing and multiplex control logic 161, a multiplex 162 generates a phase swallow signal FS from the P oscillating signals of different phases by selecting a certain phase output, such that the phase swallow signal FS is formed by adding Y (Y is a non-zero integer) phases in the oscillating signal OSC per X (X is a positive integer) clocks. Thereby, the phase swallow signal FS has a frequency of:

$$f_{FS} = f_{OSC} \times \frac{X \times P}{(X \times P + Y)}.$$

Since the phase swallower 16 generates the phase swallow signal FS by adding Y phases per X clocks, when X=1, the output phase swallow signal FS has no periodic jitter. However, when X≠1, if the phase difference of added Y phases is concentrated in one clock, this clock will have a Y phase larger than other clock. At this moment, the phase swallow signal FS has a maximum periodic jitter. If the added Y phases are distributed in the X clocks, the clock period of some phase swallow signals FS is substantially the same with that the oscillating signal OSC, but some have one phase more than other clocks. In every X clock, there are Y clocks which have one more phase. Thereby, the maximum value of the periodic jitter is one phase. To avoid such periodic jitter, the phase swallow signal FS outputted from the phase swallower 16 must be divided by the output frequency divider 17, wherein the divisor S in the output frequency divider 17 is substantially the same with X or the integral times of X. Thereby, the output signal TFO has no periodic jitter.

In the aforementioned phase-lock loop for preventing frequency drift and jitter in accordance with the present invention, the parameters can be properly selected so as to generate a desired frequency signal. For example, when it is desired to generate a 125 MHz signal by a 14.31818 MHz signal, namely, the input reference signal frequency $f_{CRX}$ is 14.31818 MHz and the desired output signal frequency is 125 MHz. Considering NTSC TV signal specification, the scanning frequency FH is (4.5/286) MHz=15734.27 Hz, the field frequency FV is FH/(525/2)=59.94 Hz, and the sub-carrier frequency FSC is ((13*7*5)/2)*FH=(455/2)*FH= 3.579545 MHz. In a general TV signal application, four times the frequency 4*FSC of the sub-carrier signal is used as the frequency of image digital signals, i. e., 14.31818 MHz. Therefore, from the above description, it is known that 14.31818 MHz and 125 MHz have the following numerical relationship:

$$125 \text{ MHz}=14.31818 \text{ MHz}*550/63.$$

If the selected voltage-controlled oscillator 14 generates 10 phases, i. e., P=10, then it can be derived that the output signal frequency $f_{TFO}$ is:

$$f_{TFO} = 125 = 14.31818/M*N*10X/(10X+Y)/S$$
$$= 14.31818*550/63$$
$$= 14.31818*55/3*10/21$$
$$= 14.31818*55/3*10/7/3$$
$$= 14.31818*55/3*20/21/2.$$

Figure 2:
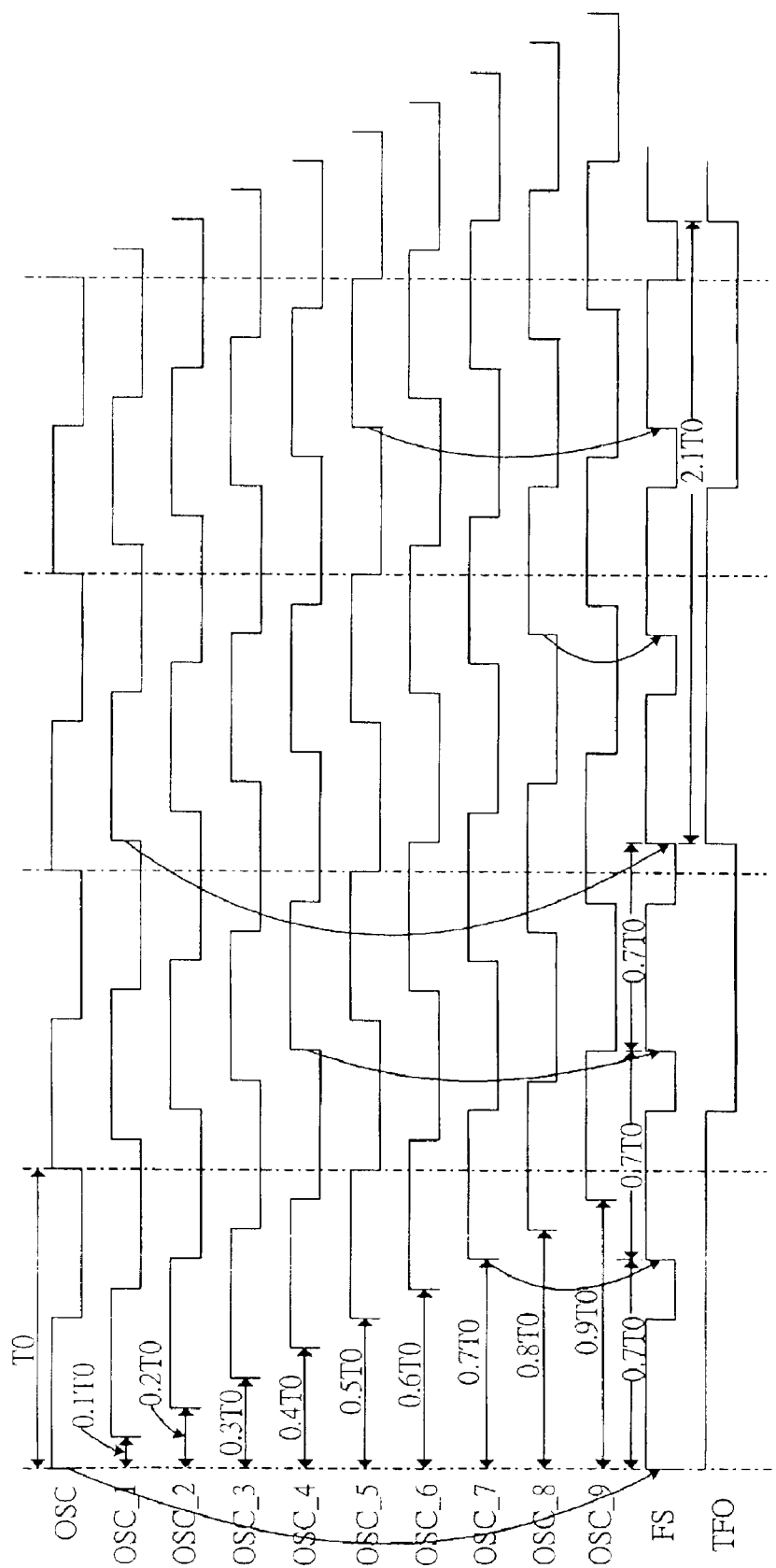
FIG. 2 shows a timing diagram of a phase-lock loop of the present invention.

Since $f_{TFO}$=14.31818/M*N*10X/(10X+Y)/S=14.31818*55/ 3*10/7/3, a set of parameters can be derived, that is, M=3, N=55, X=1, Y=−3, S=3. Since M=3 and N=55 are not large values, the frequency drift of the oscillating signal OSC will not be induced. Referring to FIG. 2, the timing diagram of the oscillating signal OSC processed by phase swallow is illustrated. As shown, since X=1 and Y=−3, this represents that each clock has a reduction of three phases. Thus no jitter is generated. Therefore, in FIG. 2, the phase swallow signal FS has no jitter and the period of the phase swallow signal FS is 0.7 times of the oscillating signal OSC, namely, $f_{FS}=f_{OSC}/0.7=262.5$ MHz/0.7=375 MHz. When the phase swallow signal FS is divided by 3 by the output frequency divider 17, $f_{TFO}$=fFS/3=375 MHz/3=125 MHz.

Figure 3:
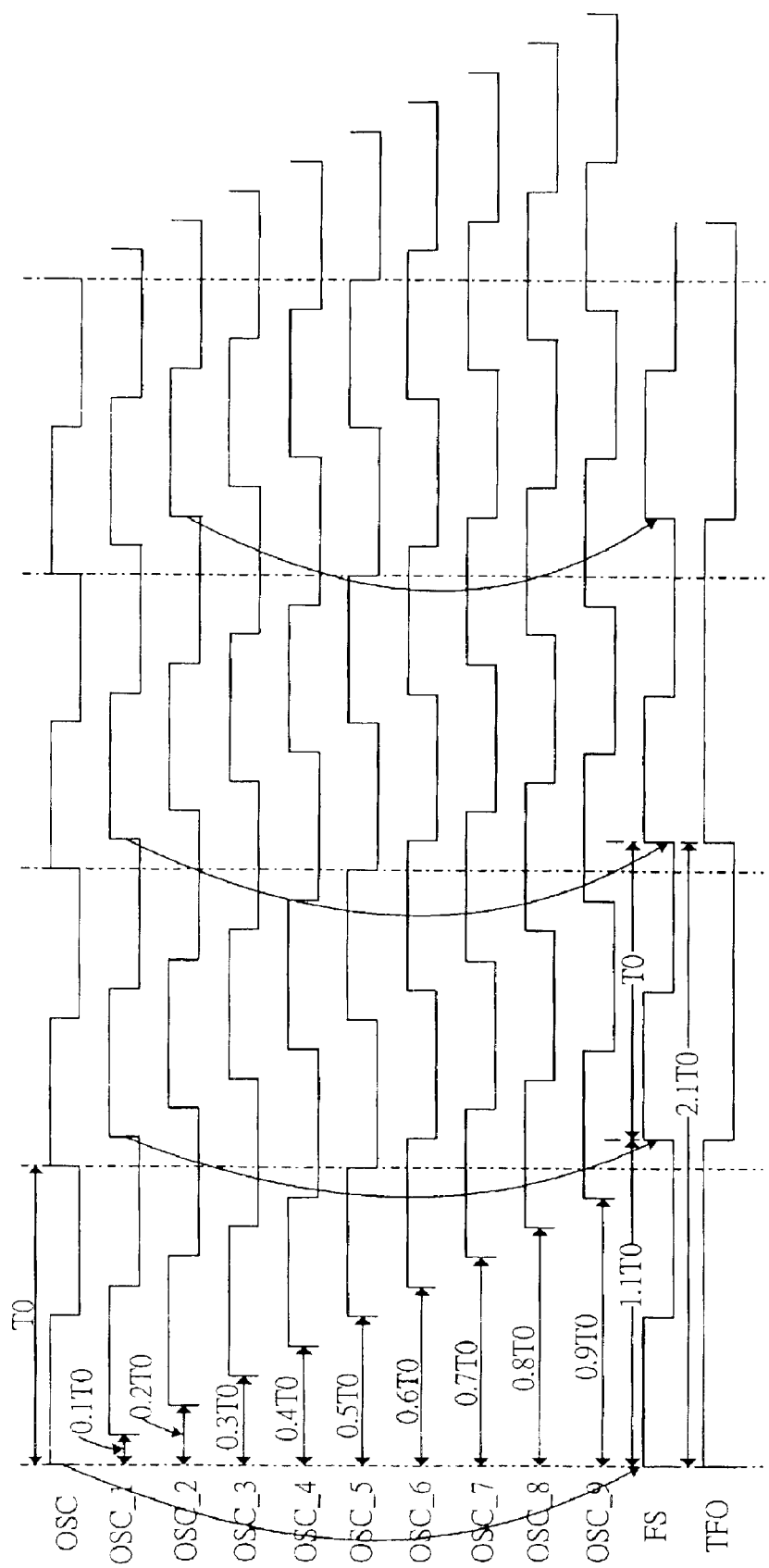
FIG. 3 shows another timing diagram of a phase-lock loop of the present invention.

Moreover, since $f_{TFO}$=14.31818/M*N*10X/(10X+Y)/S= 14.31818*55/3*20/21/2, another parameter M=3, N=55, X=2, Y=1, S=2 is acquired. Similarly, since M=3 and N=55 are not large values, the frequency drift of the oscillating signal OSC will not be induced. Referring to FIG. 3, the timing diagram of the oscillating signal OSC processed by phase swallow is illustrated. As shown, since X=2 and Y=1, this represents that every two clocks have one phase added. Thus the period of the two adjacent phase swallow signals FS are 1.1T0 and 1T0 respectively. Thereby, the average period of the phase swallow signal FS is (1.1+1.0)*T0/2. Jitter will be generated and the average frequency is:

$$f_{FS} = f_{OSC}/2.1*2 = 262.5 \text{ MHz}/2.1*2 = 250 \text{ MHz}.$$

After phase swallow signal FS is divided by 2 by the output frequency divider 17, then $f_{TFO}$=fFS/2=250 MHz/2= 125 MHz. Furthermore, since X=S=2, the output signal TFO has no jitter.

Figure 4:
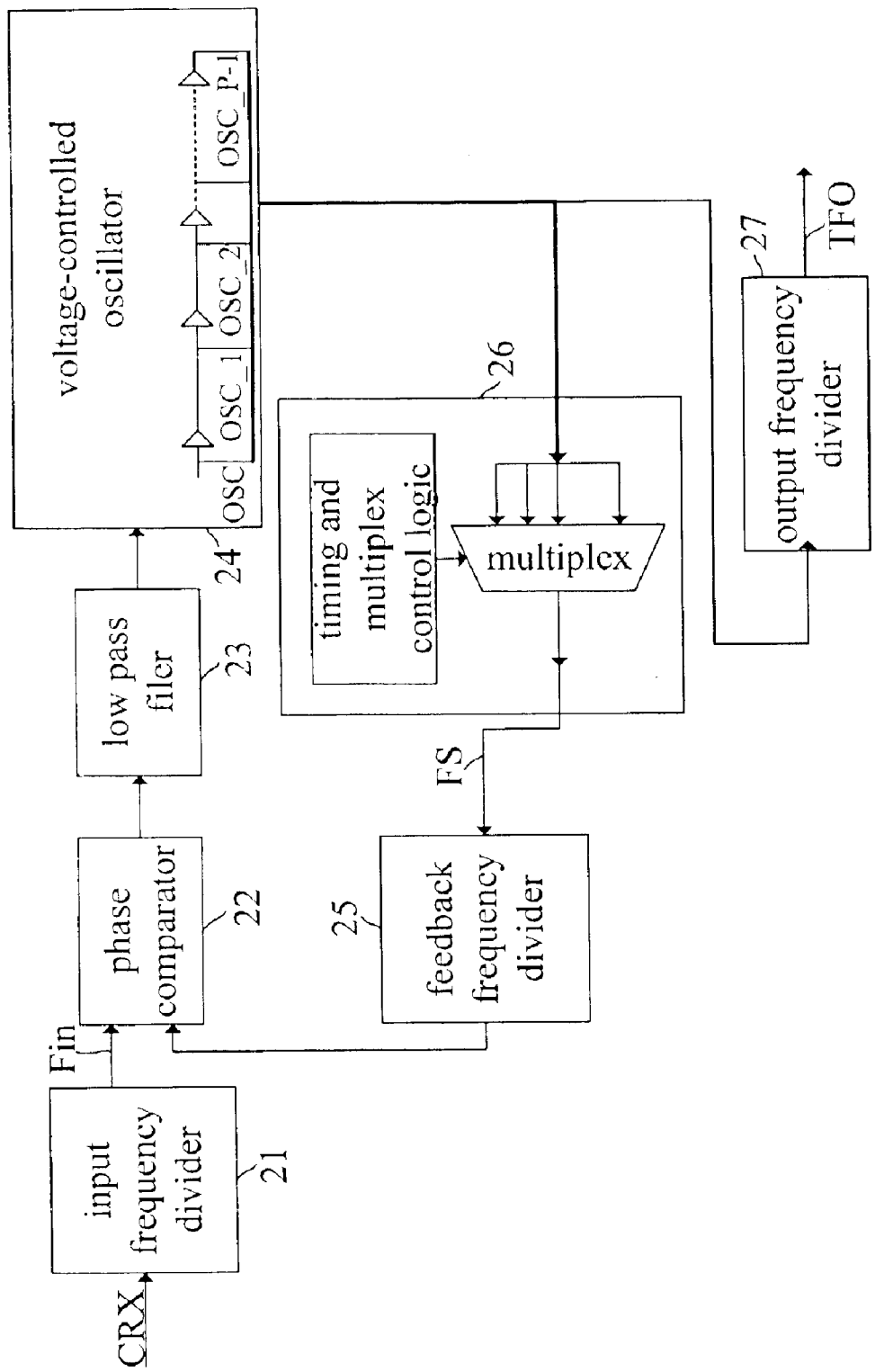
FIG. 4 shows a block diagram of another embodiment of the phase-lock loop in accordance with the present invention.

With reference to FIG. 4, a block diagram of another embodiment of the phase-lock loop for preventing frequency drift and jitter in accordance with the present invention is illustrated. This embodiment is similar to the previous one except that the phase swallow process is performed in the PLL loop. In this embodiment, the phase-lock loop is formed by an input frequency divider 21, a phase comparator 22, a low pass filer 23, a voltage-controlled oscillator 24, and a feedback frequency divider 25. The voltage-controlled oscillator 24 generates P oscillating signals (OSC, OSC_1~OSC_P-1) which are inputted into the phase swallower 26 for performing a phase swallow process to the P oscillating signals of different phases, namely, every X clock is added with Y phases. The phase swallow signal FS outputted from the phase swallower 16 is divided by the feedback frequency divider 25 of the phase-lock loop. Meanwhile, the oscillating signal OSC outputted from the phase-lock loop is sent to the output frequency divider 27 for generating the required frequency signal TFO.

In the above embodiment, the input signal CRX is divided by the input frequency divider 21 to have a signal Fin. The Fin signal has $f_{Fin} = f_{CRX}/M =$ $$f_{OSC} \times \frac{X \times P}{X \times P + Y} \times \frac{1}{N},$$

thereby, $$f_{OSC} = f_{CRX} \times \frac{X \times P + Y}{X \times P} \times \frac{N}{M},$$

and the output signal frequency $$f_{TCO} = f_{CRX} \times \frac{X \times P + Y}{X \times P} \times \frac{N}{M} \times \frac{1}{S}.$$

Likewise, if N is equal to X or integral times of X, the output of the phase swallower 26 is divided by N by the feedback frequency divider 25 so that no long period jitter is generated.

In the above embodiment, a 14.31818 MHz signal can generate a 125 MHz signal. It is known that $f_{TFO}$=125= 14.31818*550/63. Since 63 is the integral time of 7 and 3, it is selected that the voltage-controlled oscillator 24 generates 14 phases, namely P=14. Thereby, the output signal frequency $f_{TFO}$ is:

$$f_{TFO} = 125 = 14.31818/M*N*(X+Y/14)/X/S$$

$$= 14.31818*N/M*(X+Y/14)*(1/X*S)$$

$$= 14.31818*550/63$$

$$= 14.31818*55/3*10/21$$

$$= 14.31818*55/3*10/7/3$$

$$= 14.31818*(78/3)[(39*14+4)/(39*14)](1/3)$$

-continued $$= 14.31818*(78/3)[(78*14+8)/(78*14)](1/3)$$

$$= 14.31818*(79/3)[(79*14-6)/(79*14)](1/3).$$

From the above derivation, three sets of parameters are derived, which are listed in table 1. In each set, N is multiple times of X. Thereby, no jitter is generated due to phase swallow. Thus the long period jitter can be eliminated. Since N and M are not very large numbers, a signal with no jitter and accurate frequency can be generated.

TABLE 1

| M | N | OSC | Fin | X | Y | S |
|---|---|---|---|---|---|---|
| 3 | 78 | 375 MHz | 4.773 MHz | 39 | 4 | 3 |
| 3 | 78 | 375 MHz | 4.773 MHz | 78 | 8 | 3 |
| 3 | 79 | 375 MHz | 4.773 MHz | 79 | -6 | 3 |

As aforementioned, the inventive phase swallow process is used in the phase-lock loop circuit for reducing the frequency multiplication factor in the phase-lock loop. Thereby, the frequency drift can be eliminated. Moreover, by setting the divisor of the divider, the long period frequency jitter can be also eliminated. Furthermore, by the frequency relation of 125 MHz=14.31818 MHz*550/63, parameters can be set properly. Thereby, the signals of 125 MHz can be exactly acquired from the 14.31818 MHz signal.

Although the present invention has been explained in relation to its preferred embodiment, it is to be understood that many other possible modifications and variations can be made without departing from the spirit and scope of the invention as hereinafter claimed.

What is claimed is:

1. An apparatus for generating an output signal, comprising:
   a source for receiving an input signal and outputting a plurality of multiple phase oscillating signals corresponding to the input signal;
   a phase swallower for receiving the multiple phase oscillating signals, and generating a phase swallow signal by adding or removing at least one phase in the oscillating signals per X clocks, where X is a positive integer; and
   an output frequency divider for dividing the frequency of the phase swallow signal by a divisor S so as to generate the output signal;
   wherein the output frequency divider has the divisor S such that the apparatus prevents a frequency jitter problem.

2. The apparatus as claimed in claim 1, wherein the divisor S is equal to X or integral times of X.

3. The apparatus as claimed in claim 1, wherein the frequency of the output signal is $$f_{OSC} \times \frac{X \times P}{(X \times P + Y)} \times \frac{1}{S},$$

where $f_{OSC}$ is a frequency of oscillating signal, and Y is the number of added phases in the oscillating signal per X clocks, and P is the number of phases in the oscillating signals.

4. The apparatus claimed in claim 3, wherein the source is a phase-lock loop unit, the phase-lock loop unit comprises:

a phase comparator for receiving the input signal and comparing the input signal with a feedback signal, and outputting a control voltage based on phase difference of the input signal and the feedback signal;

a voltage-controlled oscillator for outputting the multiple phase oscillating signals according to the control voltage; and a feedback frequency divider for receiving one of the multiple phase oscillating signals, and dividing the frequency of the received oscillating signal by N, so as to generate the feedback signal.

5. The apparatus as claimed in claim 4, wherein the frequency of the input signal is 14.31818 MHz, and the frequency of the output signal is 125 MHz, when N=55, X=1, Y=−3, P=10, and S=9.

6. The apparatus as claimed in claim 4 further includes an input frequency divider for receiving the input signal, and dividing the input signal by a divisor M for output to the phase comparator.

7. The apparatus as claimed in claim 6, wherein the frequency of the input signal is 14.31818 MHz, and the frequency of the output signal is 125 MHz, when M=3, N=55, X=2, Y=1, P=10, and S=2.

8. The apparatus as claimed in claim 4, wherein the voltage-controlled oscillator is realized by a ring oscillator.

9. A phase-lock loop, comprising:

a phase comparator for receiving an input signal and comparing the input signal with a feedback signal, and outputting a control voltage based on phase difference of the input signal and the feedback signal;

a voltage-controlled oscillator for outputting a plurality of multiple phase oscillating signals according to the control voltage;

a phase swallower for receiving the multiple phase oscillating signals, and generating a phase swallow signal, wherein the phase swallow signal is generated by adding or removing at least one phase in the oscillating signals per X clocks, where X is an integer; and a feedback frequency divider for dividing the frequency of the phase swallow signal by a divisor N so as to generate the feedback signal;

wherein the feedback frequency divider has the divisor N such that phase-lock loop prevents a frequency jitter problem.

10. The phase-lock loop as claimed in claim 9, wherein the divisor N is equal to X or integral times of X.

11. The phase-lock loop as claimed in claim 10, wherein the frequency of the feedback signal is $$f_{OSC} \times \frac{X \times P}{(X \times P + Y)} \times \frac{1}{N},$$

where $f_{OSC}$ is a frequency of the oscillating signal, Y is the number of added phase in the oscillating signal per X clocks, and P is the number of phases in the oscillating signal.

12. The phase-lock loop as claimed in claim 11, wherein the frequency of the input signal is 4.773 MHz, and the frequency of the output signal is 375 MHz, when N=78, X=39, P=14, and Y=4.

13. The phase-lock loop as claimed in claim 11, wherein the frequency of the input signal is 4.773 MHz, and the frequency of the output signal is 375 MHz, when N=78, X=78, P=14,and Y=8.

14. The phase-lock loop as claimed in claim 11 further comprises an input frequency divider for receiving the input signal, and dividing the input signal by a divisor M for output to the phase comparator.

15. The phase-lock loop as claimed in claim 14, wherein the frequency of the input signal is 14.318 MHz, and the frequency of the output signal is 125 MHz, when M=9, N=78, X=39, P=14, and Y=4.

16. The phase-lock loop as claimed in claim 14 further comprises an output frequency divider for receiving the multiple phase oscillating signal, dividing the multiple phase oscillating signal by a divisor S and outputting an divided output signal.

17. The phase-lock loop as claimed in claim 16, wherein the frequency of the input signal is 14.318 MHz, and the frequency of the output signal is 125 MHz, when M=3, N=78, X=39, Y=4, P=14,and S=3.

18. The phase-lock loop as claimed in claim 16, wherein the frequency of the input signal is 14.318 MHz, and the frequency of the output signal is 125 MHz, when M=3, N=78, X=78, Y=8, P=14, and S=3.

19. The phase-lock loop as claimed in claim 10, wherein the voltage-controlled oscillator is realized by a ring oscillator.

20. A method for generating an output signal with an appropriate phase, comprising the steps of:

generating a plurality of multiple phase oscillating signals;

generating a phase swallow signal based on the multiple phase oscillating signals, wherein the phase swallow signal is generated by adding or removing at least one phase in the oscillating signals per X clocks, where X is a positive integer; and dividing the frequency of the phase swallow signal by a divisor S so as to generate the output signal, wherein S is equal to X or integral times of X.

* * * * *